United States Patent
Chen et al.

[19]

[11] Patent Number: 5,994,229
[45] Date of Patent: *Nov. 30, 1999

[54] ACHIEVEMENT OF TOP ROUNDING IN SHALLOW TRENCH ETCH

[75] Inventors: Chao-Cheng Chen, Matou; Chia-Shiung Tsai, Hsin-chu, both of Taiwan

[73] Assignee: Taiwan Semiconductor Manufacturing Company Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/005,567

[22] Filed: Jan. 12, 1998

[51] Int. Cl.$^6$ ................................. H01L 21/3065
[52] U.S. Cl. ........................... 438/700; 706/719
[58] Field of Search .................... 438/402, 404, 438/424, 430, 437, 296, 700, 719, 706

[56] References Cited

U.S. PATENT DOCUMENTS

| | | | |
|---|---|---|---|
| 4,528,066 | 7/1985 | Merkling, Jr. et al. | 438/696 |
| 4,639,288 | 1/1987 | Price et al. | 438/430 |
| 4,717,448 | 1/1988 | Cox et al. | 438/714 |
| 4,826,564 | 5/1989 | Desilets et al. | 216/49 |
| 4,916,086 | 4/1990 | Takahashi et al. | 438/404 |
| 5,258,332 | 11/1993 | Horioka et al. | 438/389 |
| 5,334,281 | 8/1994 | Doerre et al. | 438/404 |
| 5,801,082 | 9/1998 | Tseng | 438/424 |
| 5,801,083 | 9/1998 | Yu et al. | 438/424 |

*Primary Examiner*—Benjamin Utech
*Assistant Examiner*—Lynette T. Umez-Eronini
*Attorney, Agent, or Firm*—George O. Saile; Stephen B. Ackerman

[57] ABSTRACT

A process for forming a shallow trench having steep sidewalls near its bottom and sloping sidewalls at the top is described. The process is in 3 stages. The first stage involves methane trifluoride, carbon tetrafluoride, argon, and oxygen. The second stage involves methane trifluoride and methane monofluoride, while the third stage involves hydrogen bromide, chlorine, and helium/oxygen. If the ratio of the various components at each stage is carefully controlled along with other variables such as discharge power, pressure, and duration, the trench profile described above is obtained with a minimum of deposited polymer material on the sidewalls.

22 Claims, 2 Drawing Sheets

ACHIEVEMENT OF TOP ROUNDING IN SHALLOW TRENCH ETCH

FIELD OF THE INVENTION

The invention relates to the general field of integrated circuits with particular reference to the etching of shallow trenches.

BACKGROUND OF THE INVENTION

Shallow trench isolation is widely used in integrated circuit technology as a means for electrically isolating different parts of the circuit from each other. As the name suggests, a relatively shallow trench is etched into the silicon surface and is then filled with a suitable dielectric material, most commonly silicon oxide.

In the interests of achieving maximum circuit density, the walls of these trenches are made relatively steep, sloping in from the vertical by no more than about 80 degrees. It has, however, been observed that if the walls of the filled trench intersect the surface at near 90°, a great deal of stress builds up at the silicon to oxide interface, leading to undesirable consequences such as cracking and poor gate oxide integrity.

Because of this stress problem, there has been a great deal of interest in providing trenches with a profile such that the walls are close to vertical at the trench bottom but, near the top, gradually flair out and approach the surface less steeply.

Takahashi et al. (U.S. Pat. No. 4,916,086 April 1990) accomplish top rounding by lining their trench walls with a layer of polysilicon that is oxidized just before the trench is filled in. Price et al. (U.S. Pat. No. 4,639,288 January 1987) produce a trench with a lower portion having steep walls and an upper portion having sloping walls by first performing an isotropic silicon etch and then following that with an anisotropic silicon etch.

Horioka et al. (U.S. Pat. No. 5,258,332 November 1993) achieve rounding of trench corners by using a mixture of fluorine gas combined with at least an equal amount of oxygen. Cox et al. (U.S. Pat. No. 4,417,448 January 1988) are concerned with producing deep trenches in silicon and have developed an etch chemistry based on oxygen, hydrogen chloride, and boron trichloride.

SUMMARY OF THE INVENTION

It has been an object of the present invention to provide a process for etching, in silicon, a trench that has near vertical sides at the bottom but which slopes towards the horizontal near the top.

Another object of the present invention has been to provide an etching process that is partially anisotropic but which builds up little or no polymer coating on the vertical walls.

These objects have been achieved by using a 3 stage process. The first stage involves methane trifluoride, carbon tetrafluoride, argon, and oxygen. The second stage involves methane trifluoride and methane monofluoride, and causes the slope to be more horizontal near the top, while the third stage involves hydrogen bromide, chlorine, and helium/oxygen. The ratio of the various components at each stage is carefully controlled as are other variables such as discharge power, pressure, and duration.

DESCRIPTION OF THE PREFERRED EMBODIMENTS

At least two mechanisms are generally recognized as being involved in anisotropic etching by the method of Reactive Ion Etching (RIE). The first mechanism is relevant if ion bombardment (sputtering) is playing a role, since far more ions strike horizontal surfaces than vertical ones. The second mechanism is more complex and is the result of a protective polymer layer building up on the vertical surfaces.

The protective polymer layer derives from the interaction of the discharge with organic material that originates in the photoresist and, possibly, organic compounds that are used for the etchant itself. In general, the thicker the polymer layer the more anisotropic the etch. However, while desirable for producing steep walls, the polymer layer tends to be difficult to remove once etching is complete so it is important to ensure that the polymer layer is no thicker than what is needed to achieve the desired level of anisotropy.

Because of the large number of variables involved, it is presently not possible to predict what operating conditions, such as composition, gas flow rates, pressure, discharge power, etc. are optimum for achieving a given result. Furthermore, to achieve a given profile for an etched trench, it is generally necessary to change these operating conditions several times during the course of the total etch procedure.

Figure 1:
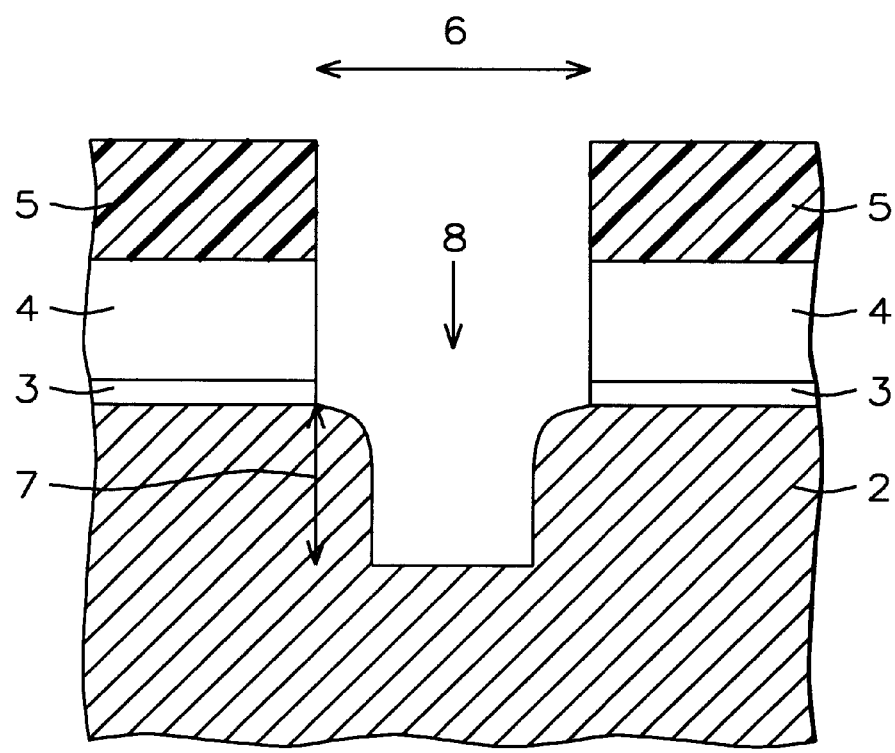
FIG. 1 is a cross-section showing the profile of a trench that has been formed according to the teachings of the present invention.

Referring now to FIG. 1, we show, in schematic cross-section, the profile of an etched trench. The present invention teaches how this profile can be obtained while at the same time leaving little or no polymeric material behind on the trench walls. Width 6 of trench 8 is between about 0.3 and 2 microns while its length (in the dimension running normal to the plane of the figure) is between about 0.3 and 5 microns. Depth 7 of the trench is between about 3,000 and 4,500 Angstroms. Near the bottom of the trench the walls are almost vertical, departing from vertical by no more than about 15 degrees. Starting about 2,500 to 4,000 Angstroms above the bottom, the walls gradually acquire a more horizontal orientation so that, by the time the trench top is reached, the walls depart from the vertical by between about 20 and 40 degrees.

We have determined that the process which we now describe leads to the trench profile of FIG. 1. Although ranges are given for each of the relevant variables, it should be noted that the invention will not work satisfactorily if an attempt is made to operate outside these ranges. For best results, the preferred values that we give below should be used.

Figure 2:
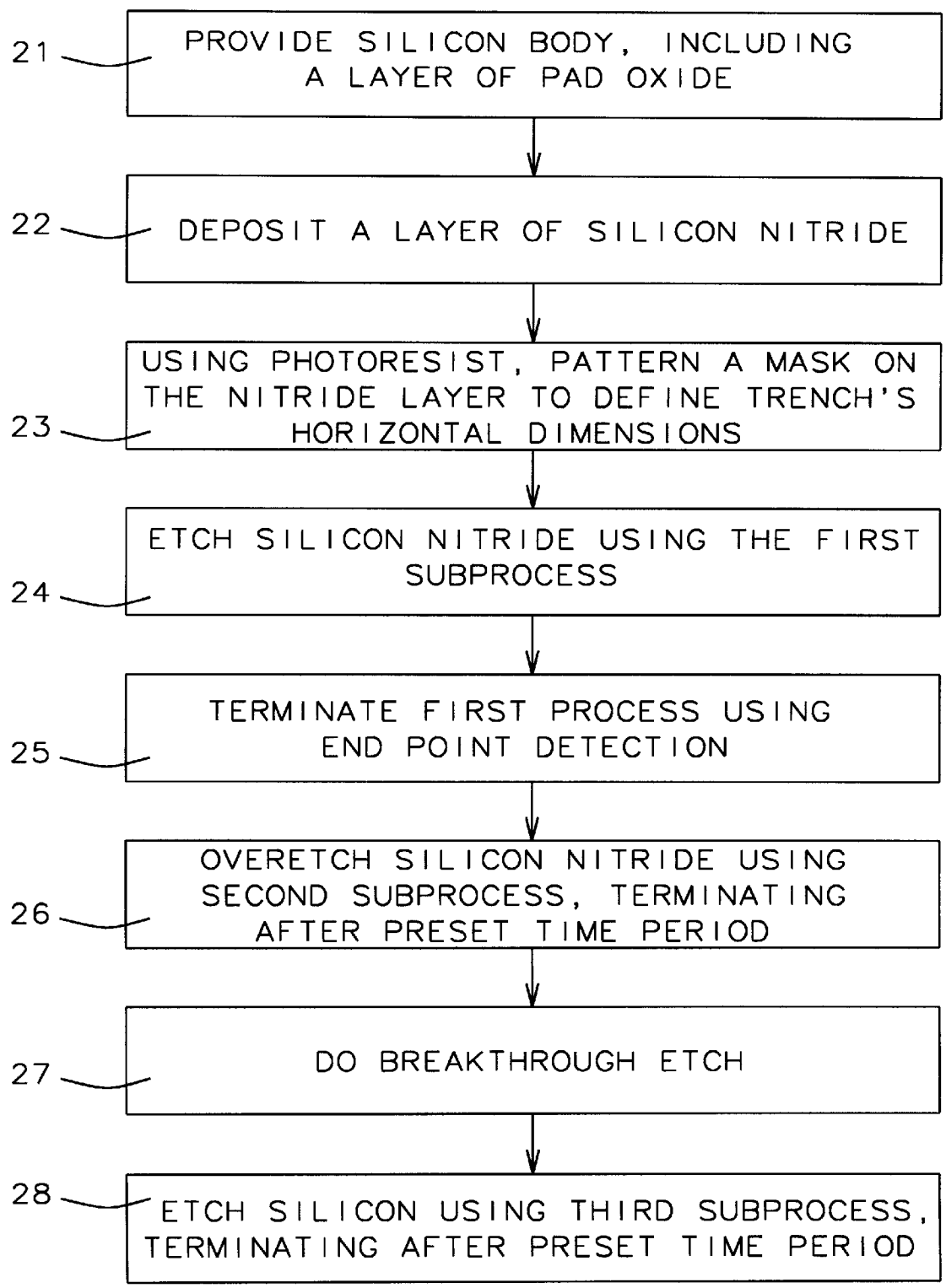
FIG. 2 is a flow chart that provides an overview of the process of the present invention.

Referring now to FIG. 2, the process starts at 21 with the provision of silicon body, or substrate, 2 on which is formed layer of pad oxide 3 to a thickness between about 100 and 200 Angstroms. A layer of silicon nitride 4, between about 1,000 and 2,000 Angstroms thick, is then laid down (see 22).

In 23, a layer of photoresist 5, between about 0.5 and 0.9 Angstroms thick, is then spin coated onto the surface of 4. The photoresist is exposed through a suitable mask so that, after development, the surface is protected everywhere except where the trench is to be etched, thereby defining the trench's horizontal dimensions.

Continuing reference to FIG. 2, the first of several subprocesses is now used to etch away the silicon nitride see 24):

A glow discharge is initiated at a preferred pressure of about 50 millitorr, but any pressure betweeen about 30 and 150 millitorr will still work. Four different gases are admitted simultaneously, but at different flow rates:

The preferred flow rate for methane trifluoride is about 10 standard cubic cm. per minute (SCCM), but any flow rate between about 5 and 30 SCCM will work. The preferred flow rate for carbon tetrafluoride is about 15 SCCM but any flow rate between about 5 and 45 SCCM will work. The preferred flow rate for argon is about 100 SCCM, but any flow rate between about 50 and 200 SCCM will work. The preferred flow rate for oxygen is about 6 SCCM but any flow rate up to about 10 SCCM will work.

The optimum power level for the glow discharge is about 600 watts but any power level between about 300 and 900 watts will work.

An important feature of this subprocess is that the duration of its application is determined not by time, but by an end point detection method based on determining, by optical emission spectroscopy, when the intensity of the line at 3960 Angstroms begins to decrease (see 25).

Once the first subprocess has been terminated, the second subprocess (see 26), which involves overetching the silicon nitride and etching through the pad oxide, is initiated:

While maintaining the glow discharge, the pressure is adjusted to a preferred value of about 100 millitorr although any value betweeen about 50 and 150 millitorr would still be satisfactory. Three different gases are admitted simultaneously, but at different flow rates to achieve high selectivity of oxide over silicon:

The preferred flow rate for methane trifluoride is about 10 SCCM but any flow rate between about 5 and 20 SCCM is acceptable. The preferred flow rate for methane monofluoride is also about 10 SCCM but any flow rate between about 5 and 20 SCCM would work. The preferred flow rate for argon is about 100 SCCM, but any flow rate between about 50 and 150 SCCM is acceptable.

The optimum power level for the glow discharge is about 800 watts but any power level between about 500 and 1,200 watts will work.

After a preferred time period of about 20 seconds (although any time period between about 5 and 30 seconds may be used), the overetch (second) subprocess is terminated.

The second subprocess is followed by a breakthrough etch (BT) (see 27). This involves maintaining the glow discharge while the pressure remains at the preferred value of 100 millitorr, although any pressure betweeen about 50 and 150 millitorr could be used.

Carbon tetrafluoride is admitted at a preferred flow rate of about 35 SCCM (although any flow rate between about 15 and 50 SCCM may be used).

The optimum power level for the glow discharge is about 400 watts but any power level between about 300 and 600 watts will work.

After a preferred time period of about 5 seconds (although any time period between about 5 and 15 seconds may be used), BT is terminated.

While maintaining the glow discharge, the third subprocess which is a silicon etch, is initiated (see 28):

The pressure is adjusted to a preferred value of about 120 millitorr although any value betweeen about 60 and 150 millitorr would still be satisfactory. Three different gases are admitted simultaneously, but at different flow rates:

The preferred flow rate for hydrogen bromide is about 100 SCCM but any flow rate between about 50 and 200 SCCM would work. The preferred flow rate for chlorine is about 10 SCCM but any flow rate between about 5 and 35 SCCM is acceptable. The preferred flow rate for a helium/oxygen mixture is about 45 SCCM but any flow rate between about 5 and 50 SCCM would still work.

After a preferred time period of about 45 seconds (although this will vary depending on the desired depth), the silicon etch (third) subprocess is terminated.

At this point the process of the present invention is essentially complete and all that remains is to remove the layer of photoresist. This is done using standard methods.

While the invention has been particularly shown and described with reference to the preferred embodiments thereof, it will be understood by those skilled in the art that various changes in form and details may be made without departing from the spirit and scope of the invention.

What is claimed is:

1. A process for etching a trench having a length, a width, a top, a bottom, and a depth, comprising the sequential steps of:

providing a silicon body having a surface;

forming layer of pad oxide on said surface;

depositing a layer of silicon nitride on the pad oxide;

depositing layer of photoresist;

patterning the layer of photoresist to define the trench's length and width;

etching the silicon nitride using a first subprocess;

terminating the first subprocess by means of end point detection;

overetching the silicon nitride and etching through the pad oxide, using a second subprocess having a high oxide to silicon selectivity;

after a first period of time has elapsed, terminating the second subprocess;

then performing a breakthrough etch;

after a second period of time has elapsed, terminating BT;

at a pressure betweeen about 60 and 150 millitorr, simultaneously admitting hydrogen bromide at between about 50 and 200 SCCM, chlorine at between about 5 and 35 SCCM, helium/oxygen at between about 5 and 50 SCCM, and carbon tetrafluoride at between about 5 and 30 SCCM, and then initiating a glow discharge at a power level between about 300 and 900 watts, whereby selective etching of the silicon occurs, thereby forming trench walls that are almost vertical near the bottom and that slope towards the horizontal near the top;

after a third period of time has elapsed, terminating selective silicon etching; and removing the layer of photoresist.

2. The process of claim 1 wherein the first subprocess further comprises:

at a pressure betweeen about 30 and 150 millitorr, simultaneously admitting methane trifluoride at between about 5 and 30 SCCM, carbon tetrafluoride at between about 5 and 45 SCCM, argon at between about 50 and 200 SCCM, and oxygen at up to about 10 SCCM, and then initiating a glow discharge at a power level between about 300 and 900 watts, whereby reactive ion etching occurs.

3. The process of claim 1 wherein the second subprocess further comprises:

at a pressure between about 50 and 150 millitorr, simultaneously admitting a gas selected from the group consisting of methane trifluoride, a polymer-forming fluorocarbon, and a fluorinated hydrocarbon, at between about 5 and 20 SCCM, methane monofluoride at between about 5 and 20 SCCM, and argon at between about 50 and 150 SCCM, and then initiating a glow discharge at a power level between about 500 and 1,200 watts, whereby reactive ion etching occurs.

4. The process of claim 1 wherein the breakthrough etch further comprises:

at a pressure betweeen about 50 and 150 millitorr, simultaneously admitting carbon tetrafluoride at between about 15 and 50 SCCM, and then initiating a glow discharge at a power level between about 300 and 600 watts, whereby reactive ion etching occurs.

5. The process of claim 1 wherein the step of detecting an endpoint is optical emission spectroscopy.

6. The process of claim 1 wherein the first period of time depends on silicon nitride thickness.

7. The process of claim 1 wherein the second period of time is between about 5 and 30 seconds.

8. The process of claim 1 wherein the third period of time is dependent on the depth required.

9. The process of claim 1 wherein the trench width is between about 0.3 and 2 microns and the trench length is between about 0.3 and 5 microns.

10. The process of claim 1 wherein the trench depth is between about 3,000 and 4,500 Angstroms.

11. The process of claim 1 wherein the silicon nitride layer is deposited to a thickness between about 1,000 and 2,000 Angstroms.

12. A process for etching a trench having a length, a width, a top, a bottom, and a depth, comprising the sequential steps of:

providing a silicon body having a surface;

forming layer of pad oxide on said surface;

depositing a layer of silicon nitride on the pad oxide;

depositing layer of photoresist;

patterning the layer of photoresist to define the trench's length and width;

etching the silicon nitride using a first subprocess;

terminating the first subprocess by means of end point detection;

overetching the silicon nitride using a second subprocess;

after a first period of time has elapsed, terminating the second subprocess;

at a pressure between about 50 and 150 millitorr, simultaneously admitting hydrogen bromide at between about 50 and 200 SCCM, chlorine at between 5 and 35 SCCM, helium/oxygen at between about 5 and 50 SCCM, and carbon tetrafluoride at between about 15 and 50 SCCM, and then initiating a glow discharge at a power level between about 300 and 600 watts, whereby breakthrough etching occurs;

after a second period of time has elapsed, terminating breakthrough etching;

etching the silicon using a third subprocess, thereby forming trench walls that are almost vertical near the bottom and that slope towards the horizontal near the top;

after a third period of time has elapsed, terminating the third subprocess; and removing the layer of photoresist.

13. The process of claim 12 wherein the first subprocess further comprises:

at a pressure betweeen about 30 and 150 millitorr, simultaneously admitting methane trifluoride at between about 5 and 30 SCCM, carbon tetrafluoride at between about 5 and 45 SCCM, argon at between about 50 and 200 SCCM, and oxygen at up to about 10 SCCM, and then initiating a glow discharge at a power level between about 300 and 900 watts, whereby reactive ion etching occurs.

14. The process of claim 12 wherein the second subprocess further comprises:

at a pressure betweeen about 50 and 150 millitorr, simultaneously admitting methane trifluoride at between about 5 and 20 SCCM, methane monofluoride at between about 5 and 20 SCCM, and argon at between about 50 and 150 SCCM, and then initiating a glow discharge at a power level between about 500 and 1,200 watts, whereby reactive ion etching occurs.

15. The process of claim 12 wherein the third subprocess further comprises:

at a pressure betweeen about 60 and 150 millitorr, simultaneously admitting hydrogen bromide at between about 50 and 200 SCCM, chlorine at between about 5 and 35 SCCM, helium/oxygen at between about 5 and 50 SCCM, and carbon tetrafluoride at between about 5 and 30 SCCM, and then initiating a glow discharge at a power level between about 300 and 900 watts, whereby reactive ion etching occurs.

16. The process of claim 12 wherein the step of detecting an endpoint is optical emission spectroscopy.

17. The process of claim 12 wherein the first period of time is between about 5 and 30 seconds.

18. The process of claim 12 wherein the second period of time is between about 5 and 30 seconds.

19. The process of claim 12 wherein the third period of time is dependent on the depth required.

20. The process of claim 12 wherein the trench width is between about 0.3 and 2 microns and the trench length is between about 0.3 and 5 microns.

21. The process of claim 12 wherein the trench depth is between about 3,000 and 4,500 Angstroms.

22. The process of claim 12 wherein the silicon nitride layer is deposited to a thickness between about 1,000 and 2,000 Angstroms.

* * * * *